US006819153B2

(12) United States Patent
Sonobe

(10) Patent No.: US 6,819,153 B2
(45) Date of Patent: Nov. 16, 2004

(54) SEMICONDUCTOR DEVICE FOR CLOCK SIGNALS SYNCHRONIZATION ACCURACY

(75) Inventor: Hiroshi Sonobe, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/108,007

(22) Filed: Mar. 27, 2002

(65) Prior Publication Data

US 2002/0140472 A1 Oct. 3, 2002

(30) Foreign Application Priority Data

Mar. 27, 2001 (JP) ........................................ 2001-090653

(51) Int. Cl.[7] .............................................. H03L 7/06
(52) U.S. Cl. ....................................... 327/158; 327/161
(58) Field of Search ................................ 327/143, 144, 327/146, 147, 148, 151, 153, 156, 149, 157, 158, 160, 161; 331/25, DIG. 2; 375/373, 375, 376

(56) References Cited

U.S. PATENT DOCUMENTS

| 5,216,302 | A | | 6/1993 | Tanizawa ..................... 327/159 |
| 5,491,673 | A | * | 2/1996 | Okayasu ...................... 368/120 |
| 6,044,122 | A | * | 3/2000 | Ellersick et al. ............. 375/360 |
| 6,073,259 | A | * | 6/2000 | Sartschev et al. ............ 714/724 |
| 6,100,735 | A | | 8/2000 | Lu ............................... 327/158 |
| 6,125,157 | A | | 9/2000 | Donnelly et al. ............ 375/371 |
| 6,147,525 | A | * | 11/2000 | Mitani et al. ................. 327/119 |
| 6,154,073 | A | | 11/2000 | Choi ............................ 327/161 |
| 6,259,293 | B1 | | 7/2001 | Hayase et al. ............... 327/276 |

FOREIGN PATENT DOCUMENTS

| JP | 05110388 A | 4/1993 | ............. H03K/3/37 |
| JP | 06326574 A | 11/1994 | ........... H03K/5/135 |

* cited by examiner

Primary Examiner—Timothy P. Callahan
Assistant Examiner—Linh M. Nguyen
(74) Attorney, Agent, or Firm—Wall Marjama & Bilinski LLP

(57) ABSTRACT

A semiconductor device that generates a clock which is synchronized with a reference signal stably and with fixed synchronization accuracy, and enables to deal with an abrupt variation in the reference signal. This semiconductor device includes N stages of delay elements each delaying an external clock by 1/N clock (N: an integer that is two or larger); a phase comparator for comparing the phase of a clock that has been delayed by the N stages of the delay elements with the phase of the external clock one clock late; a controller that receives a phase difference detected by the phase comparator and controls respective delays of the delay elements; and a selector for selecting a delayed clock having the closest phase to the reference signal from delayed clocks which are generated by the N stages of the delay elements, respectively, and shifted in phase with each other by 1/N clock.

9 Claims, 10 Drawing Sheets

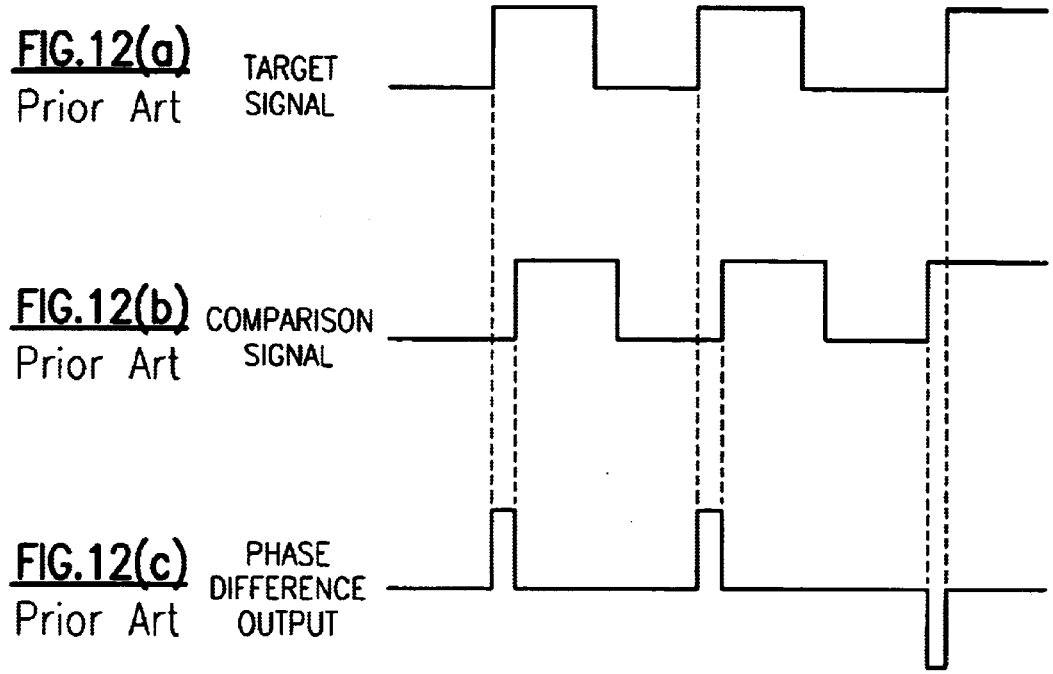
FIG.12(a) Prior Art  TARGET SIGNAL
FIG.12(b) Prior Art  COMPARISON SIGNAL
FIG.12(c) Prior Art  PHASE DIFFERENCE OUTPUT
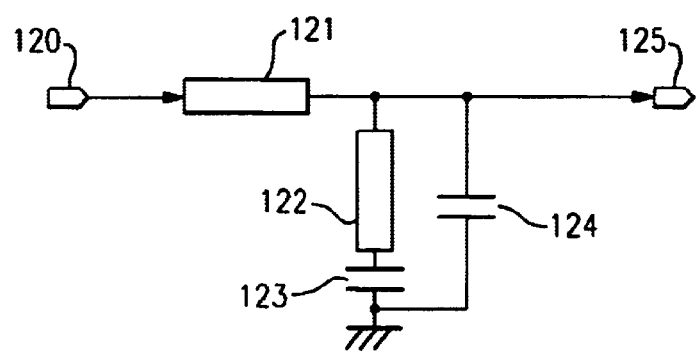
FIG.13
Prior Art

US 6,819,153 B2

SEMICONDUCTOR DEVICE FOR CLOCK SIGNALS SYNCHRONIZATION ACCURACY

FIELD OF THE INVENTION

The present invention relates to semiconductor devices and, more particularly, to a semiconductor device which generates a clock signal that is synchronized with a reference signal, like a horizontal synchronizing signal in a video signal.

BACKGROUND OF THE INVENTION

In recent years, video signal processing in digital has been advancing, and semiconductor devices for synchronizing a clock that is employed in the video signal processing with reference signal like a horizontal synchronizing signal in a video signal are utilized in the video signal processing. Hereinafter, these conventional semiconductor devices will be described.

A first prior art is described with reference to FIGS. 9, 11, 12 and 13.

FIG. 9 is a circuit diagram illustrating a prior art semiconductor device.

In FIG. 9, a reference signal input terminal 101 receives a reference signal. A phase comparator 102 compares an output of a dividing circuit 105 with the reference signal to generate a difference signal, and outputs the difference signal as a phase difference output. A low-pass filter (hereinafter, referred to as LPF) 103 converts the phase difference signal that is outputted from the phase comparator 102 into a voltage, and outputs an obtained voltage as a control voltage for controlling a VCO 104. The VCO 104 is controlled by the control voltage that is outputted from the LPF 103, and converts a clock frequency on the basis of the phase difference to output a synchronous clock (sync clock). The dividing circuit 105 divides the sync clock that is outputted from the VCO 104, and outputs the obtained signal to the phase comparator 102 as a comparison signal. The sync clock that is outputted from the VCO 104 is outputted to the outside from a clock output terminal 106.

FIG. 11 is a circuit diagram illustrating the phase comparator 102 shown in FIG. 9. Reference numeral 110 denotes a target signal input terminal. Numeral 111 denotes a comparison signal input terminal. Numeral 112 denotes a phase difference output terminal. FIGS. 12(a) to 12(c) are timing charts for explaining the phase comparator 102 shown in FIG. 11. FIG. 12(a) shows a signal waveform of a target signal that is inputted to the target signal input terminal 110. FIG. 12(b) shows a signal waveform of a comparison signal that is inputted to the comparison signal input terminal 111. FIG. 12(c) shows a signal waveform of a phase difference output that is outputted from the phase difference output terminal 112.

FIG. 13 is a circuit diagram illustrating the LPF 103 shown in FIG. 9. Numeral 120 denotes a phase difference input terminal. Numerals 121 and 122 denote resistors. Numerals 123 and 124 denote capacitors. Numeral 125 denotes a control voltage output terminal. The LPF 103 constituted as described above converts the phase difference signal which is outputted from the phase comparator 102 and is inputted to the phase difference input terminal 120 into a voltage, and outputs the obtained voltage from the control voltage output terminal 125 as a control voltage for controlling the VCO 104.

Next, the operation of the first prior art semiconductor device will be described.

The reference signal that is inputted through the reference signal input terminal 101 is inputted to the phase comparator 102 as a target signal. A clock that is synchronized with the reference signal is generated by the VCO 104 and is outputted to the dividing circuit 105 as well as to the outside through the clock output terminal 106.

The sync clock inputted to the dividing circuit 105 is frequency-divided by the dividing circuit 105, and the divided clock is inputted to the phase comparator 102 as a comparison signal. At this time, the dividing circuit 105 divides the sync clock so that the frequency of the reference signal coincides with the frequency of the comparison signal.

The phase comparator 102 compares the comparison signal with the reference signal as the target signal to generate a difference signal, and outputs the difference signal as a phase difference output.

As the phase comparator 102, a phase comparator shown in FIG. 11 is commonly used. The reference signal is inputted as a target signal to the target signal input terminal 110, and the signal obtained by the dividing circuit 105 is inputted to the comparison signal input terminal 111 as a comparison signal. When a change point of the target signal is located before a change point of the comparison signal as shown in FIG. 12, an H pulse corresponding to the phase difference is outputted to the phase difference output terminal 112 as a phase difference output. When the change point of the target signal is located behind the change point of the comparison signal, an L pulse corresponding to the phase difference is outputted to the phase difference output terminal 112 as a phase difference output.

Then, the phase difference output that is a pulse outputted from the phase comparator 102 is inputted to the LPF 103, and is converted into a voltage for controlling the VCO 104 to be inputted to the VCO 104 as a control voltage.

Then, the VCO 104 is controlled by the control voltage outputted from the LPF 103, and changes the frequency of the clock outputted from the VCO 104 by the phase difference.

By repeating the above-mentioned operation until the phase comparator 102 comes to detect no phase difference between the signal obtained by the dividing circuit 105 and the reference signal inputted through the reference signal input terminal 101, a clock signal that is synchronized with the reference signal which is inputted through the reference signal input terminal 101 can be generated, and a clock signal synchronized with the reference signal can be outputted from the clock output terminal 106.

A second prior art will be described with reference to FIG. 10.

FIG. 10 is a circuit diagram illustrating a prior art semiconductor device for synchronizing a clock with a reference signal. Numeral 131 denotes a clock input terminal. Numerals 132 to 139 denote buffers. Numeral 140 denotes a reference signal input terminal. Numeral 141 denotes a selector. Numeral 142 denotes a sync clock output terminal.

Next, the operation of the prior art semiconductor device for synchronizing a clock with a reference signal is described.

A clock having the same frequency as that of a desired clock is inputted to the clock input terminal 131. The inputted clock is delayed by the buffers 132 to 139, and clocks which are slightly shifted in phase with each other are outputted from the respective buffers.

The selector 141 selects a clock having a phase closest to that of the reference signal that is inputted through the reference signal input terminal 140, from the clocks having the various phases which are outputted from the respective buffers 132 to 139, and outputs the selected clock as a sync clock from the sync clock output terminal 142.

As described above, in this second prior art, the selector 141 selects a clock having a phase closest to that of the reference signal, thereby obtaining a clock synchronized with the reference signal.

However, in the first prior art, the sync clock is generated by repeating the phase comparison between the reference signal inputted through the reference signal input terminal 101 and a clock signal to be synchronized with the reference signal by means of the phase comparator 102. Therefore, when the phase of the reference signal varies abruptly, it is hard for the sync clock to follow the reference signal. Further, in order to keep the frequency of the sync clock constant, it is required to keep the control voltage of the VCO 104 at a constant value after clock synchronization with the reference signal is performed and before the next reference signal is inputted. However, when the interval between the reference signals is large, the oscillated frequency of the VCO 104 varies due to interferences such as supply voltage noises occurring in the control voltage for the VCO 104, thereby making it difficult to keep the synchronization.

On the other hand, in the second prior art, delayed clocks are generated by the buffers 132 to 139 and one of the clocks which are outputted from the buffers 132 to 139 and have respective phases is selected on the basis of the reference signal to be outputted as a sync signal, whereby the signal can follow even an abrupt phase change in the reference signal, while when the voltages of the buffers 132 to 139 or the temperature vary due to interferences, delays of clocks by the buffers 132 to 139 would vary. Because the delays of the clocks by the buffers 132 to 139 should vary due to variations in the voltage or the temperature, even when the selector 141 selects a clock having a phase that is the closest to that of the inputted reference signal, a sync clock with sufficient accuracy cannot be obtained. Particularly, an LSI which is a system including a plurality of devices such as logic circuits which have various functions on one chip is easily affected by interferences from other devices, whereby sync clocks with sufficient accuracy cannot be obtained.

Further, in order to obtain sufficient accuracy, the delays of the buffers that perform delaying need be made smaller, which increases the number of stages. However, when the delays of the buffers that perform delaying are made smaller and the number of stages is increased, the circuit scales of the buffers and the selector are adversely increased.

SUMMARY OF THE INVENTION

The present invention has for its object to provide a semiconductor device which can generate a clock signal accurately synchronized with a reference signal even when the phase of the reference signal abruptly changes, even when the phase interval between the reference signals is large, or even when interferences of the voltage or the temperature occur, and which is particularly useful when a high-speed clock is to be synchronized with a reference clock.

Other objects and advantages of the present invention will become apparent from the detailed description and specific embodiments described are provided only for illustration since various additions and modifications within the spirit and scope of the invention will be apparent to those of skill in the art from the detailed description.

According to a 1st aspect of the present invention, there is provided a semiconductor device comprising: an external clock input means for receiving an external clock that is a clock to be synchronized; N stages of delay elements each delaying the external clock by 1/N clock (N is an integer that is two or larger); a phase comparison means for comparing a phase of a clock that has been delayed by the N stages of the delay elements with a phase of the external clock one clock late, and detecting a phase difference; a control means for controlling respective delays of the delay elements on the basis of the phase difference detected by the phase comparison means; a reference signal input terminal for receiving a reference signal; and a selection means for selecting one of delayed clocks which are generated by the N stages of the delay elements, respectively, and shifted in phase with each other by 1/N clock, on the basis of the reference signal, and outputting the selected clock as a synchronous clock. Therefore, frequencies of the clocks which are outputted from the respective delay elements can be kept constant without being affected by interferences of the voltage or the temperature. Consequently, a synchronous clock having higher synchronization accuracy can be always obtained.

According to a 2nd aspect of the present invention, in the semiconductor device of the 1st aspect, the selection means selects a delayed clock having a change point which is behind a change point of the reference signal and is closest thereto, among the delayed clocks which are generated by the N stages of the delay elements, respectively, and are shifted in phase with each other by 1/N clock. Therefore, even when the interval between the reference signals is large or even when the reference signal abruptly changes, a clock accurately synchronized with the reference signal can be obtained.

According to a 3rd aspect of the present invention, in the semiconductor device of the 1st aspect, the selection means selects a delayed clock having a change point that is before a change point of the reference signal and is the closest thereto, among the delayed clocks which are generated by the N stages of the delay elements, respectively, and are shifted in phases with each other by 1/N clock. Therefore, even when the interval between the reference signals is large or even when the reference signal abruptly changes, clocks which are accurately synchronized with the reference signal can be obtained.

According to a 4th aspect of the present invention, in the semiconductor device of any of the 1st to 3rd aspect, the selection means comprises: a latch circuit for latching each of the delayed clocks which are generated by the N stages of the delay elements, respectively, and are shifted in phase with each other by 1/N clock, in accordance with the reference signal; a control circuit for deciding a timing of the clock selection; and a multiplexer for receiving outputs from the latch circuit, and selecting one of the delayed clocks which are shifted in phase with each other by 1/N clock, at the decided timing that is outputted by the control circuit. Therefore, the switching timings of the delayed clocks which are outputted from the delay elements are fixed, thereby facilitating the use of synchronous clocks in systems that employ thus generated synchronous clocks.

According to a 5th aspect of the present invention, the semiconductor device of any of the 1st to 4th aspect further includes: a clock stop means for temporarily stopping the delayed clocks which are generated by the N stages of the delay elements, respectively, and are shifted in phase with each other by 1/N clock, at the clock selection by the selection means. Therefore, occurrence of a clock having a pulse length that is shorter than that of the normal clock can be prevented at the clock switching, whereby improper operations in the systems that employ the generated sync clocks can be prevented.

According to a 6th aspect of the present invention, the semiconductor device of any of the 1st to 4th aspect further includes: a pre-delay detection means for detecting whether or not the delays of the N stages of the delay elements are smaller than a predetermined value, and outputting an obtained result to the control means, and the control means controls the N stages of the delay elements on the basis of the output from the pre-delay detection means so that the delays have the predetermined value. Therefore, the comparison in the phase comparison means between the phase of the non-delay clock and the phase of the external clock one clock late can be prevented, whereby the delayed clocks which are shifted in phase with each other by 1/N clock can be always generated.

According to a 7th aspect of the present invention, in the semiconductor device of the 6th aspect, the pre-delay detection means includes: a dividing circuit for dividing the external clock; a first latch circuit comprising latch circuits of two or more stages for receiving an output from the dividing circuit and delaying the output in clock units; delay elements of (N+1) stages or more which receive the output from the dividing circuit and have the same delays as those of the N stages of the delay elements; a second latch circuit for latching an output from the delay elements of (N+1) stages or more, in accordance with the external clock; and a comparator for comparing an output from the first latch circuit with an output from the second latch circuit. Therefore, variations in the delays of the delay elements are always monitored to quickly detect that the delays of the delay elements are slightly varied by the interferences, whereby the delays of the delay elements can be controlled to the predetermined value. Consequently a clock that is accurately synchronized with the reference signal can be generated.

According to an 8th aspect of the present invention, the semiconductor device of any of the 1st to 4th aspect further includes: a post-delay detection means for detecting whether the delays of the N stages of the delay elements are larger than a predetermined value, and outputting an obtained result to the control means, and the control means controls the N stages of the delay elements on the basis of the output from the post-delay detection means so that the delays have a predetermined value. Therefore, the comparison by the phase comparison means between the phase of a delayed clock that has been delayed by two clocks or more and the phase of the external clock one clock late can be prevented, whereby the delayed clocks which are shifted in phase with each other by 1/N clock can be always generated.

According to a 9th aspect of the present invention, in the semiconductor device of the 8th aspect, the post-delay detection means includes: a dividing circuit for dividing the external clock; a third latch circuit for receiving an output from the dividing circuit and delaying the output by one clock; delay elements of (N−1) stages or less which receive the output from the dividing circuit and have the same delays as those of the N stages of the delay elements; a fourth latch circuit for latching an output from the delay elements of (N−1) stages or less, in accordance with the external clock; and a comparator for comparing an output from the third latch circuit with an output from the fourth latch circuit. Therefore, variations in the delays of delay elements are always monitored to quickly detect that the delays of the delay elements are greatly varied due to the interferences, whereby the delays of the delay elements are controlled to a predetermined value. Consequently, a clock that is accurately synchronized with the reference signal can be generated.

BRIEF DESCRIPTION OF THE DRAWING

For a further understanding of these and other objects of the invention, reference will be made to the following detailed description of the invention which is to be read in connection with the accompanying drawing, wherein:

FIGS. 12(a) to 12(c) are timing charts for explaining the typical phase comparator.

FIG. 13 is a circuit diagram illustrating a typical LPF.

DETAILED DESCRIPTION OF THE INVENTION

Hereinafter, embodiments of the present invention will be described with reference to the drawings. The embodiments shown here are illustrative only and the present invention is not limited to these embodiments.

A semiconductor device according to a first embodiment of the present invention will be described with reference to FIGS. 1 and 2.

Figure 1:
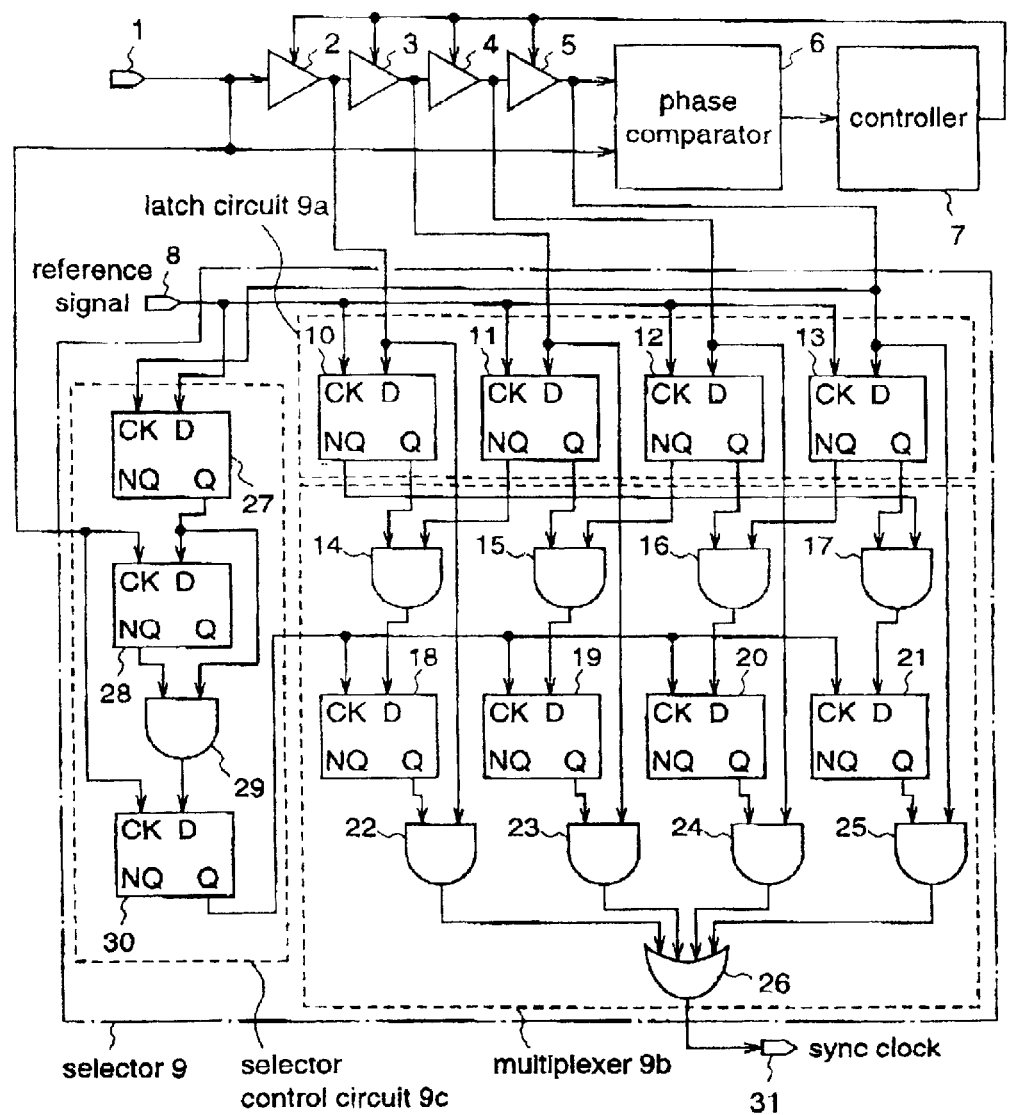
FIG. 1 is a circuit diagram illustrating a semiconductor device according to a first embodiment of the present invention.

FIG. 1 is a circuit diagram illustrating a semiconductor device according to the first embodiment.

In FIG. 1, the semiconductor device according to the first embodiment comprises a clock input terminal 1, delay elements 2 to 5, a phase comparator 6, a controller 7, a reference signal input terminal 8, a selector 9, and a sync clock output terminal 31.

The clock input terminal 1 receives a clock having the same frequency as that of a clock to be synchronized with.

Each of the delay elements 2 to 5 shifts the phase of the clock which is inputted through the clock input terminal 1, by 1/4 phase. The delay element is constituted, for example, by a CMOS.

The phase comparator 6 compares a delayed clock outputted from the delay element 5, which is delayed by one clock (4/4-clock delay), with a clock that is one clock late with relative to the clock inputted through the clock input terminal 1.

The controller 7 controls the delay elements 2 to 5 on the basis of the output from the phase comparator 6.

The selector 9 selects a clock having the closest phase to the reference signal inputted through the reference signal input terminal 8, from the outputs from the delay elements 2 to 5, and outputs the selected clock to the outside through the sync clock output terminal 31 as a sync clock. To be more specific, the selector 9 includes a latch circuit 9a comprising FFs (flip-flops) 10, 11, 12 and 13, a multiplexer 9b comprising AND circuits 14, 15, 16 and 17, FFs 18, 19, 20 and 21, AND circuits 22, 23, 24 and 25, and an OR circuit 26, and a selector control circuit 9c comprising FFs 27 and 28, an AND circuit 29, and a FF 30.

Next, the operation of the semiconductor device according to the first embodiment is described with reference to FIGS. 2.

Figure 2:
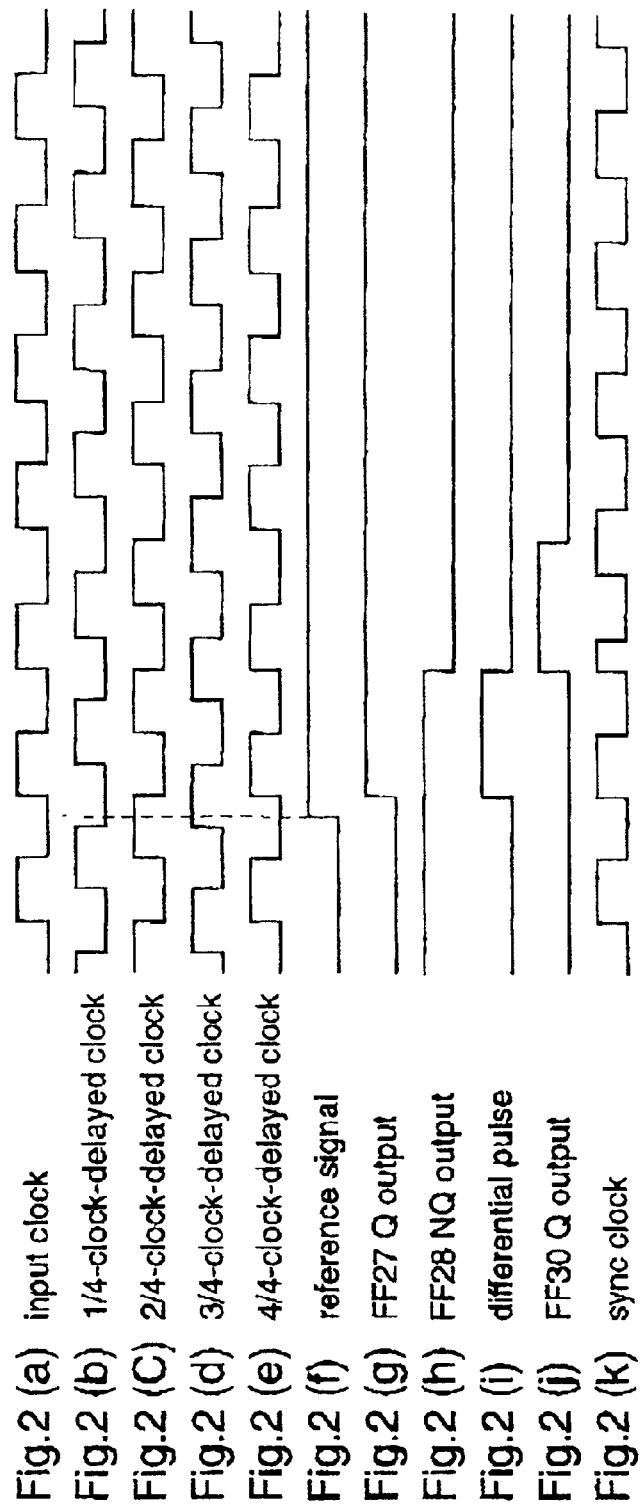
FIGS. 2(a) to 2(k) are timing charts for explaining the semiconductor device according to the first embodiment.

FIGS. 2 are timing charts for explaining the semiconductor device according to the first embodiment. FIG. 2(a) shows an input clock that is inputted through the clock input terminal 1. FIG. 2(b) shows a 1/4-clock-delayed clock that is outputted from the delay element 2. FIG. 2(c) shows a 2/4-clock-delayed clock that is outputted from the delay element 3. FIG. 2(d) shows a 3/4-clock-delayed clock that is outputted from the delay element 4. FIG. 2(e) shows a 1-clock(4/4-clock)-delayed clock that is outputted from the delay element 5. FIG. 2(f) shows a reference signal that is inputted through the reference signal input terminal 8. FIG. 2(g) shows a Q output of the FF 27. FIG. 2(h) shows an NQ output of the FF 28. FIG. 2(i) shows a differential pulse that is outputted from the AND circuit 29. FIG. 2(j) shows a Q output of the FF 30. FIG. (k) shows a sync clock that is outputted through the sync clock output terminal 31.

When a clock having the same frequency as that of the clock to be synchronized as shown in FIG. 2(a), is inputted through the clock input terminal 1, this input clock is shifted by the delay elements 2 to 5, respectively, by 1/4 phase, whereby the delayed clocks as shown in FIGS. 2(b) to 2(e) are generated.

Here, the respective delays of the delay elements 2 to 5 may be varied by the interferences of the voltage or the temperature. Thus, the delays are controlled by the phase comparator 6 and the controller 7.

Hereinafter, the control over the delays of the delay elements 2 to 5 by the phase comparator 6 and the controller 7 is described.

The phase comparator 6 compares a clock that is one clock late with relative to the clock inputted through the clock input terminal 1, as shown in FIG. 2(a), with a 1-clock-delayed clock that is outputted from the delay element 5 as shown in FIG. 2(e), and outputs a phase difference output to the controller 7. The controller 7 generates a control signal for controlling the respective delays of the delay elements 2 to 5 on the basis of the phase difference output that is outputted from the phase comparator 6.

Figure 10:
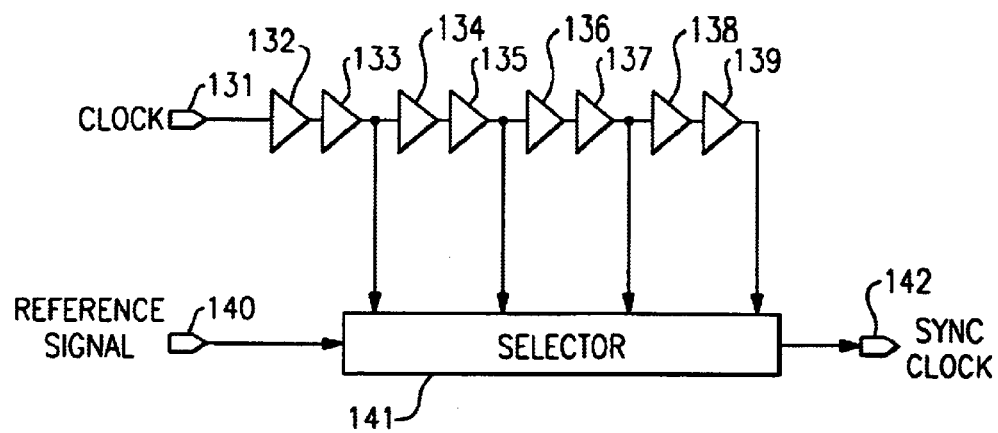
FIG. 10 is a circuit diagram illustrating a semiconductor device according to a second prior art.
Figure 11:
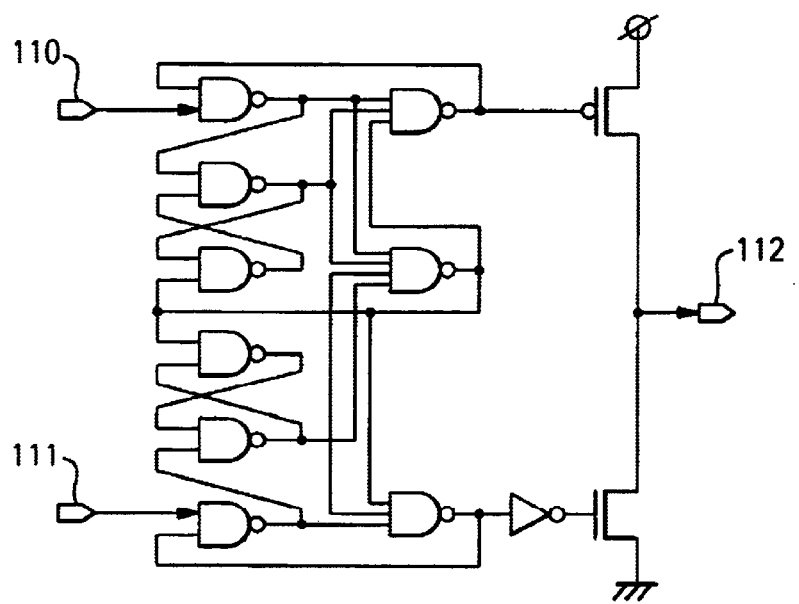
FIG. 11 is a circuit diagram illustrating a typical phase comparator.

When a phase comparator as shown in FIG. 10 is employed as the phase comparator 6, a 1-clock-delayed clock as the output of the delay element 5, which is inputted through the comparison signal input terminal 111, is compared with a clock that is one clock late with relative to the clock inputted through the target signal input terminal 110 to generate a difference signal, and the generated difference signal is outputted as the phase difference output. In this case, an LPF as shown in FIG. 12 can be employed as the controller 7, and the phase difference output is converted into a voltage value and outputted as a control signal.

The respective delays of the delay elements 2 to 5 are controlled by a control signal that is outputted from the controller 7 (a voltage when the LPF in FIG. 12 is employed) for shifting the phase of the input clock by 1/4 clock, respectively.

The operation of controlling the delays of delay elements 2 to 5 is repeated while generating sync clocks, and accordingly the controller 7 controls the delays of delay elements 2 to 5 so that the phase comparator 6 detects no phase difference.

As described above, the phase comparator 6 and the controller 7 control the respective delays of the delay elements 2 to 5, whereby the delayed clocks which are shifted in phase with each other by 1/4 clock can always be generated by the delay elements 2 to 5 without being affected by variations in the voltage or temperature.

Next, in FIG. 1, the selector 9 selects a clock having the closest phase to the reference signal inputted through the reference signal input terminal 8, from the delayed clocks which are shifted in phase with each other by 1/4 clock, outputted from the delay elements 2 to 5, and outputs the selected clock as a sync clock through the sync clock output terminal 31.

Hereinafter, the clock selection by the selector 9 is specifically described.

The FFs 10 to 13 latch the delayed clocks 2(b) to 2(e) which are outputted from the delay elements 2 to 5 in accordance with the reference signal that is inputted through the reference signal input terminal 8, respectively. That is, the FFs 10 to 13 hold states of the outputs from the delay elements 2 to 5, respectively, at a timing when the reference signal rises. Therefore, when the reference signal is generated at a timing as shown in FIG. 2(f), the FFs 10 and 13 hold L and the FFs 11 and 12 hold H.

The data latched by the FFs 10 to 13 is decoded by the AND circuits 14 to 17 to be signals for selecting a clock. That is, when the reference signal is generated at the timing shown in FIG. 2(f), only the output of the AND circuit 16 is H and the outputs of the AND circuits 14, 15 and 17 are L.

On the other hand, the reference signal inputted through the reference signal input terminal 8 is latched by the FF 27 in accordance with a 1-clock-delayed clock that is outputted from the delay element 5, and an FF27 Q output as shown in FIG. 2(g) is outputted from the FF 27. This FF27 Q output (g) is further latched by the FF 28 in accordance with the clock that has been inputted through the clock input terminal 1, and an FF28 NQ output as shown in FIG. 2(h) is outputted from the FF 28.

The FF27 Q output that is outputted from the FF 27 and the FF28 NQ output that is outputted from the FF 28 are operated by the AND circuit 29, and a differential pulse of the reference signal as shown in FIG. 2(i) is outputted from the AND circuit 29.

The output of the AND circuit 29 is latched by the FF 30 in accordance with the clock that has been inputted through the clock input terminal 1, and a FF30 Q output as shown in FIG. 2(j) as a signal that is obtained by delaying the differential pulse as shown in FIG. 2(i) by one clock is outputted from the FF 30.

Next, the above-mentioned signals decoded by the AND circuits 14 to 17 are latched by the FFs 18 to 21 in accordance with the FF30 Q output as shown in FIG. 2(j), which is outputted from the FF 30. At this time, only the output of the FF 20 is H and the outputs of the FFs 18, 19 and 21 are L.

Then, by employing the outputs of the FFs 18 to 21, the AND circuits 22 to 25 and the OR circuit 26 select one among the four delayed clocks which are outputted from the delay elements 2 to 5 at a timing when the FF30 Q output as shown in FIG. 2(j) is inputted, and generate a clock that is synchronized with the reference signal. That is, as shown in FIG. 2(k), the 4/4-clock-delayed clock that is outputted from the delay element 5 is switched to the 3/4-clock-delayed clock that is outputted from the delay element 4, corresponding to the output of the FF circuit 20 (H output), and this clock is outputted as a clock that is synchronized with the reference signal inputted through the reference signal input terminal 8.

As described above, as can be seen from FIGS. 2, the selector 9 selects a delayed clock that has a change point that is located before the change point of the inputted reference signal and is the closest thereto, from the delayed clocks which are outputted from the delay elements 2 to 5.

Figure 3:
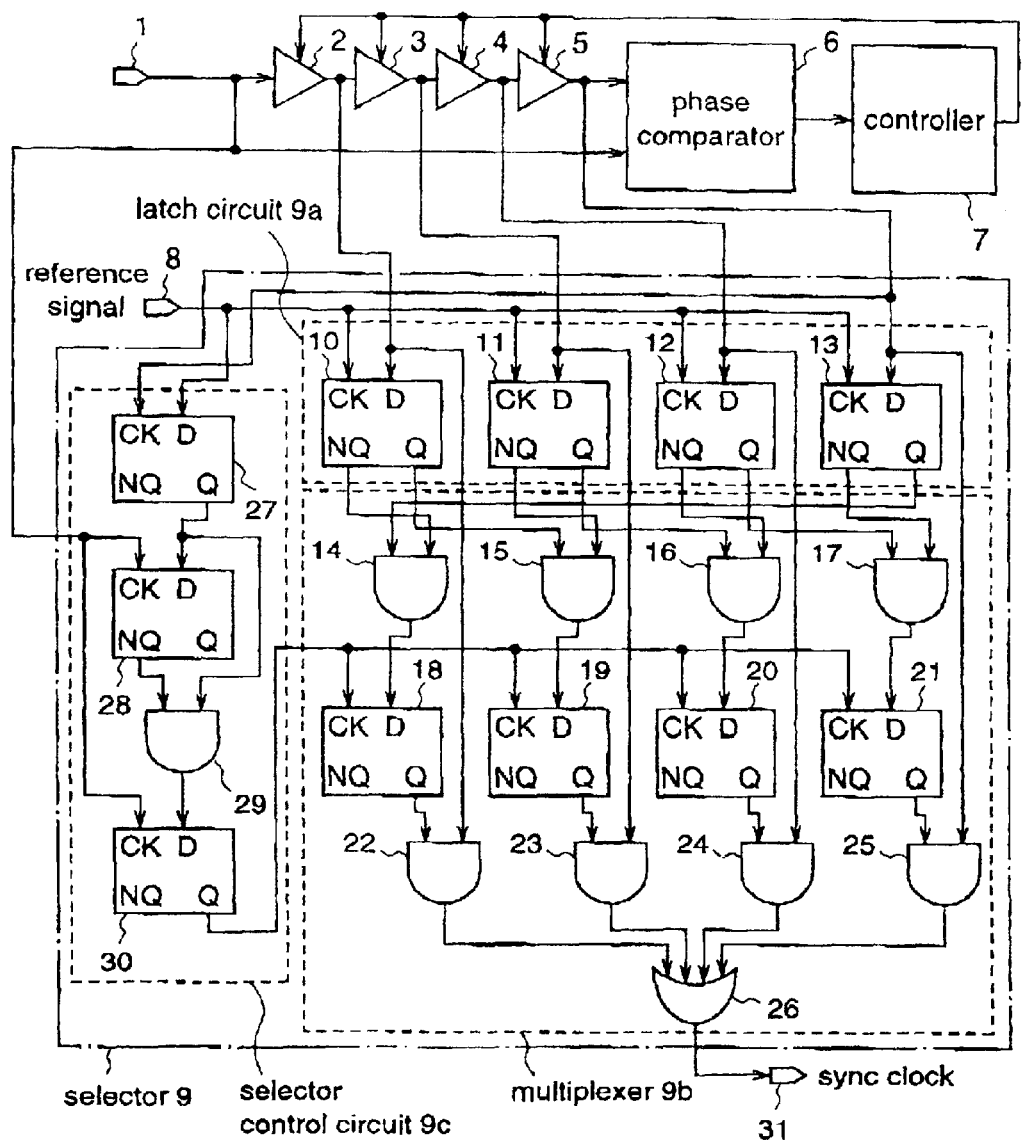
FIG. 3 is a circuit diagram illustrating a semiconductor device according to the first embodiment.

When a delayed clock having a change point which is located behind the change point of the inputted reference signal and is closest thereto is selected from the delayed clocks which are outputted from the delay elements 2 to 5, N outputs and NQ outputs which are outputted from the FFs 10 to 13 to the AND circuits 14 to 17 are constituted as shown in FIG. 3.

In this semiconductor device of the first embodiment, the respective delays of the delay elements 2 to 5 are constantly controlled by the phase comparator 6 and the controller 7, whereby delayed clocks which are shifted in phase with each other by 1/4clock can be generated as the output from the delay elements, without being affected by interferences such as voltage and temperature. This semiconductor device is further provided with the selector 9 that selects one of the delayed clocks which are shifted in phase with each other by 1/4 clock, with referring to the phase of the reference signal, whereby the clock can follow even an abrupt variation of the reference signal. Therefore, even when the interval between the reference signals is large, the frequencies of the clocks outputted from the respective delay elements can be kept constant.

In this first embodiment, in order to simplify the descriptions, the delay elements comprise four stages, while the same effects as those in the first embodiment can be obtained by providing at least two stages of the delay elements. When the delay elements comprise N stages (N is an integer that is two or larger), each of the delay elements delays the clock so as to be shifted in phase with each other by 1/N clock. Further, when the number of stages is increased, the synchronization accuracy of a sync clock that is generated can be improved.

Hereinafter, a semiconductor device according to a second embodiment of the present invention will be described with reference to FIGS. 4 and 5.

In the semiconductor device of the first embodiment, when the selector 9 switches a sync clock that is to be outputted from the sync clock output terminal 31, a pulse temporarily having a smaller pulse length (a pulse having a narrower H level as shown in FIG. 2(k)) may occur. Thus, when the sync clock has a length that is shorter than the pulse length of the normal clock, malfunctions may occur in systems utilizing this sync clock.

In a semiconductor device according to this second embodiment, a sync clock that is synchronized with a reference signal can be generated even at the clock switching, without generating a clock having a pulse length which is shorter than that of the normal clock.

Figure 4:
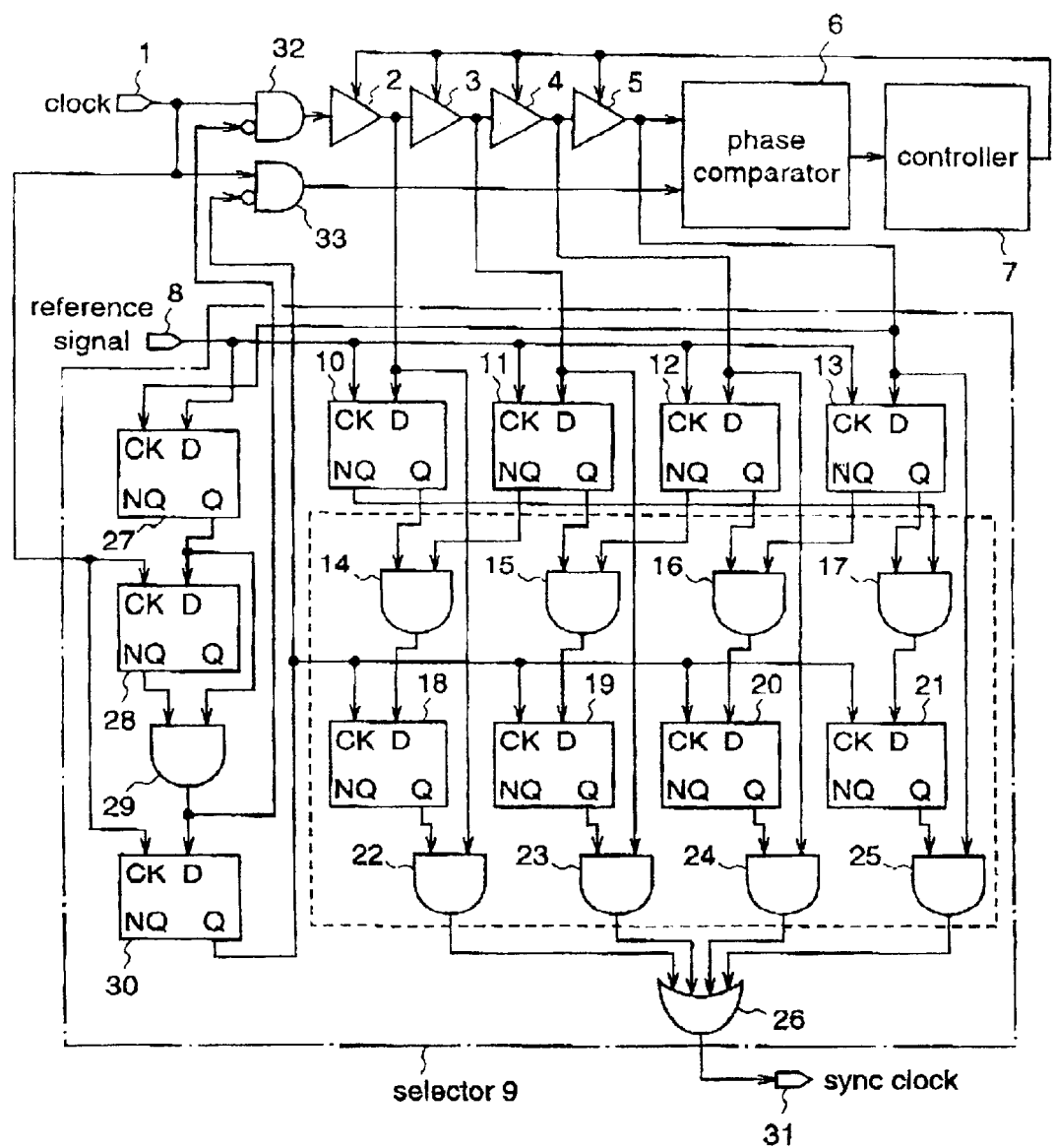
FIG. 4 is a circuit diagram illustrating a semiconductor device according to a second embodiment of the present invention.

FIG. 4 is a circuit diagram illustrating the semiconductor device according to the second embodiment. In this figure, the same numerals as those in FIG. 1 denote the same or corresponding components.

In FIG. 4, the semiconductor device of the second embodiment comprises a clock input terminal 1, delay elements 2 to 5, a phase comparator 6, a controller 7, a reference signal input terminal 8, a selector 9, a sync clock output terminal 31, and AND circuits 32 and 33.

The AND circuit 32 obtains an AND between a clock that is inputted through the clock input terminal 1 and a differential pulse of a reference signal, which is outputted by the AND circuit 29. The AND circuit 33 obtains an AND between the clock that is inputted through the clock input terminal 1 and a Q output of the FF 30.

Next, the operation of the semiconductor device according to the second embodiment is described with reference to FIG. 5.

FIGS. 5(a) to 5(m) are timing charts for explaining the semiconductor device of the second embodiment. FIG. 5(a) shows an input clock, FIG. 5(b) shows a reference signal, FIG. 5(c) shows a Q output of the FF 27, FIG. 5(d) shows an NQ output of the FF 28, FIG. 5(e) shows a differential pulse that is outputted from the AND circuit 29, FIG. 5(f) shows a Q output of the FF 30, FIG. 5(g) shows an output of the AND circuit 32, FIG. 5(h) shows an output of the delay element 2, FIG. 5(i) shows an output of the delay element 3, FIG. 5(j) shows an output of the delay element 4, FIG. 5(k) shows an output of the delay element 5, FIG. 5(l) shows an output of the AND circuit 33, and FIG. 5(m) shows a sync clock that is outputted from the sync clock output terminal 31.

When a reference signal as shown in FIG. 5(b) is inputted through the reference signal input terminal 8, this reference signal is latched by the FF 27 in accordance with a 1-clock-delayed clock that is outputted from the delay element 5, and the FF27 Q output (c) as shown in FIG. 5(c) is outputted from the FF 27. The FF27 Q output is further latched by the FF 28 in accordance with the clock that has been inputted through the clock input terminal 1, and the FF28 NQ output (d) as shown in FIG. 5(d) is outputted from the FF 28.

The FF27 Q output that is outputted from the FF 27 and the FF28 NQ output that is outputted from the FF 28 are operated by the AND 29, and a differential pulse of the reference signal as shown in FIG. 5(e) is outputted from the AND 29 to the FF 30 and the AND 32.

The differential pulse that is outputted from the AND 29 is latched by the FF 30 in accordance with the clock that has been inputted from the clock input terminal 1, and an FF30 Q output as a signal that is obtained by delaying the differential pulse by one clock as shown in FIG. 5(f) is outputted from the FF 30 to the FFs 23 to 26 and the AND 33.

The clock signal that is inputted through the clock input terminal 1 and the differential pulse that is outputted from the AND 29 are operated by the AND 32, and the AND32 output as shown in FIG. 5(g) is outputted from the AND 32 to the delay element 2.

When the AND between the input clock as shown in FIG. 5(a) and the differential pulse as shown in FIG. 5(e), which is outputted from the AND 29 as a reference to the timing of clock switching is obtained, a clock at the clock switching by the selector 9 can be temporarily stopped. At this time, when the target signal that is inputted to the phase comparator 6 (reference signal) is also stopped temporarily, malfunctions in the phase comparator 6 can be prevented.

The AND32 output that is outputted from the AND 32 as shown in FIG. 5(g) is inputted to the delay elements 2 to 5, and then delayed clocks as shown in FIGS. 5(h) to 5(k) which are sifted in phase with each other by 1/4 clock are generated by the delay elements 2 to 5, respectively.

These delayed clocks (h) to (k) are, as described in the first embodiment, latched by the FFs 10 to 13 in accordance with the reference signal, decoded by the AND circuits 14 to 17, and thereafter latched in accordance with the FF30 Q output that is outputted from the FF 30 as shown in FIG. 5(f).

Figure 5:
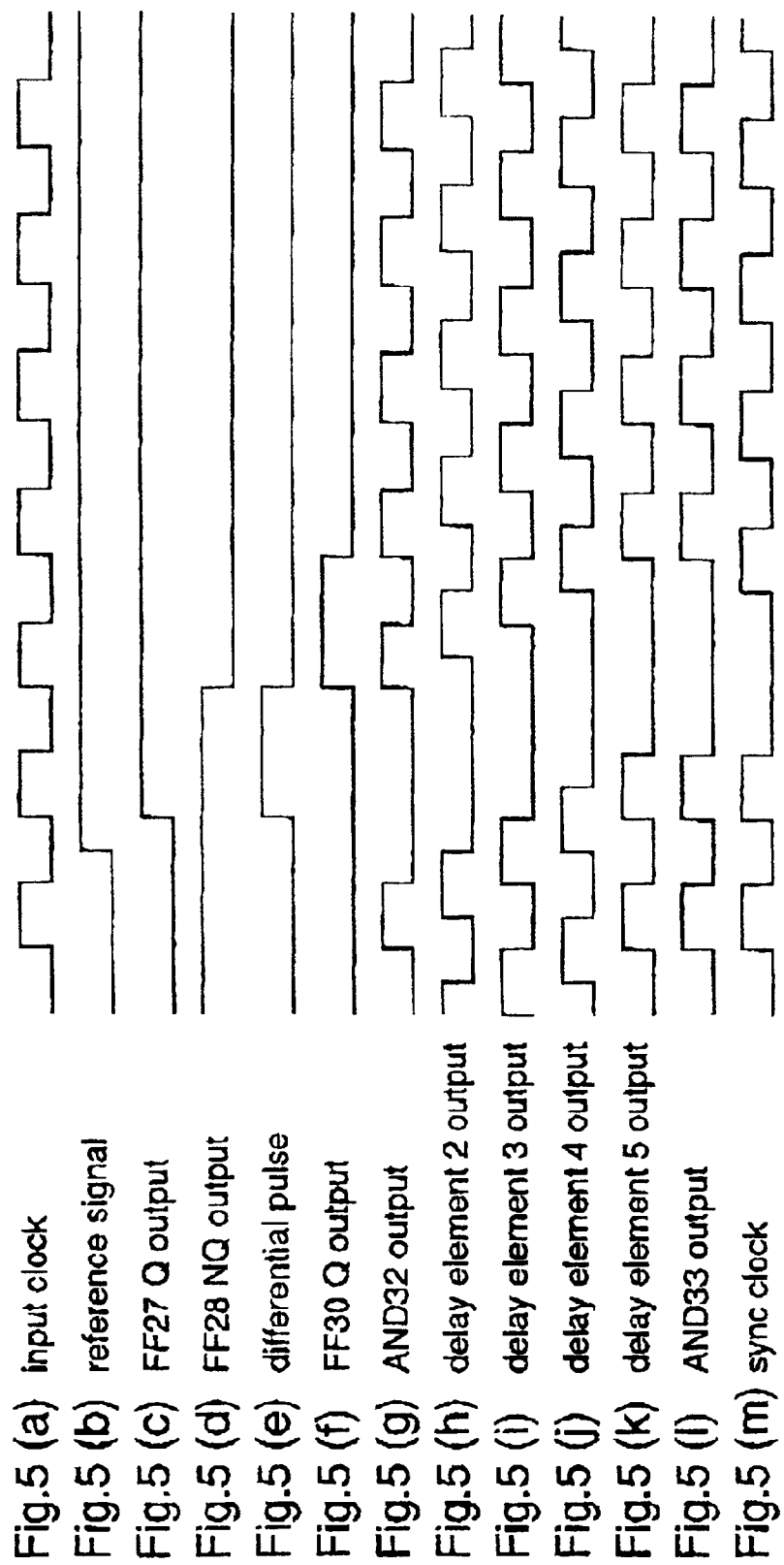
FIGS. 5(a) to 5(m) are timing charts for explaining the semiconductor device according to the second embodiment.

Therefore, when the reference signal is generated at the timing as shown in FIGS. 5, the 4/4-clock-delayed clock signal as shown in FIG. 5(k) that is outputted from the delay element 5 is switched to the 3/4-clock-delayed clock signal as shown in FIG. 5(j) that is outputted from the delay element 4.

In the sync clock that is generated as described above, a pulse having a shorter pulse length does not occur as shown in FIG. 5(m), so that the generated sync clock never has a pulse length that is shorter than that of the normal clock. Therefore, malfunctions of systems employing this sync clock can be prevented.

Further, the clock signal as shown in FIG. 5(a) that is inputted through the clock input terminal 1 and the FF30 Q output as shown in FIG. 5(f) as a signal that is obtained by delaying the differential pulse by one clock, which is outputted from the FF 30, are operated by the AND 33, and then the AND33 output as shown in FIG. 5(l) is outputted from the AND 33 to the phase comparator 6.

This AND33 output is a signal having the same clock as a clock that is obtained by delaying the AND32 output as shown in FIG. 5(g) that is outputted from the AND 32, by one clock. Therefore, the phase comparator 6 compares the phase of the delay element 5 output as shown in FIG. 5(k) that is obtained by delaying the AND32 output by one clock with the delay elements 2 to 5, with the phase of the AND33 output as shown in FIG. 5(l). Then, the controller 7 controls the respective delays of the delay elements 2 to 5 on the basis of the result of the comparison.

In this semiconductor device according to the second embodiment, the differential pulse is generated by the FFs 27, 28 and 30 and the AND 29, and the clock that is inputted to the delay elements 2 to 5 is temporarily stopped on the basis of the differential pulse. Therefore, when the clock is switched from the 1-clock-delayed clock as the delay element 5 output as shown in FIG. 5(k) to the 3/4-clock-delayed clock as the delay element 4 output as shown in FIG. 5(j), to output a sync clock through the sync signal output terminal 31, this sync clock can be generated without generating a clock having a pulse length that is shorter than the length of H level or L level of the normal clock at the clock switching, like in the prior art. Accordingly, malfunctions in systems that utilize the generated sync clock can be prevented.

In addition, in the semiconductor device according to the second embodiment, the respective delays of the delay elements 2 to 5 are constantly controlled by the phase comparator 6 and the controller 7, whereby delayed clocks which are shifted in phase with each other by 1/4 clock can be generated as the outputs from the respective delay elements without being affected by the interferences such as voltage and temperature. Further, this semiconductor device is provided with the selector 9 that selects one of the delayed clocks which are shifted in phase with each other by 1/4 clock on the basis of the phase of the reference signal, whereby the clock can follow an abrupt change of the reference signal. Accordingly, even when the interval between the reference signals is large, the frequencies of the clocks that are outputted from the delay elements can be kept constant.

Hereinafter, a semiconductor device according to a third embodiment will be described with reference to FIGS. 6 to 8.

The semiconductor device of the third embodiment is different from the semiconductor device of the first embodiment in that the respective delays of the delay elements 2 to 5 are controlled employing a pre-delay detector 34 and a post-delay detector 35.

Figure 6:
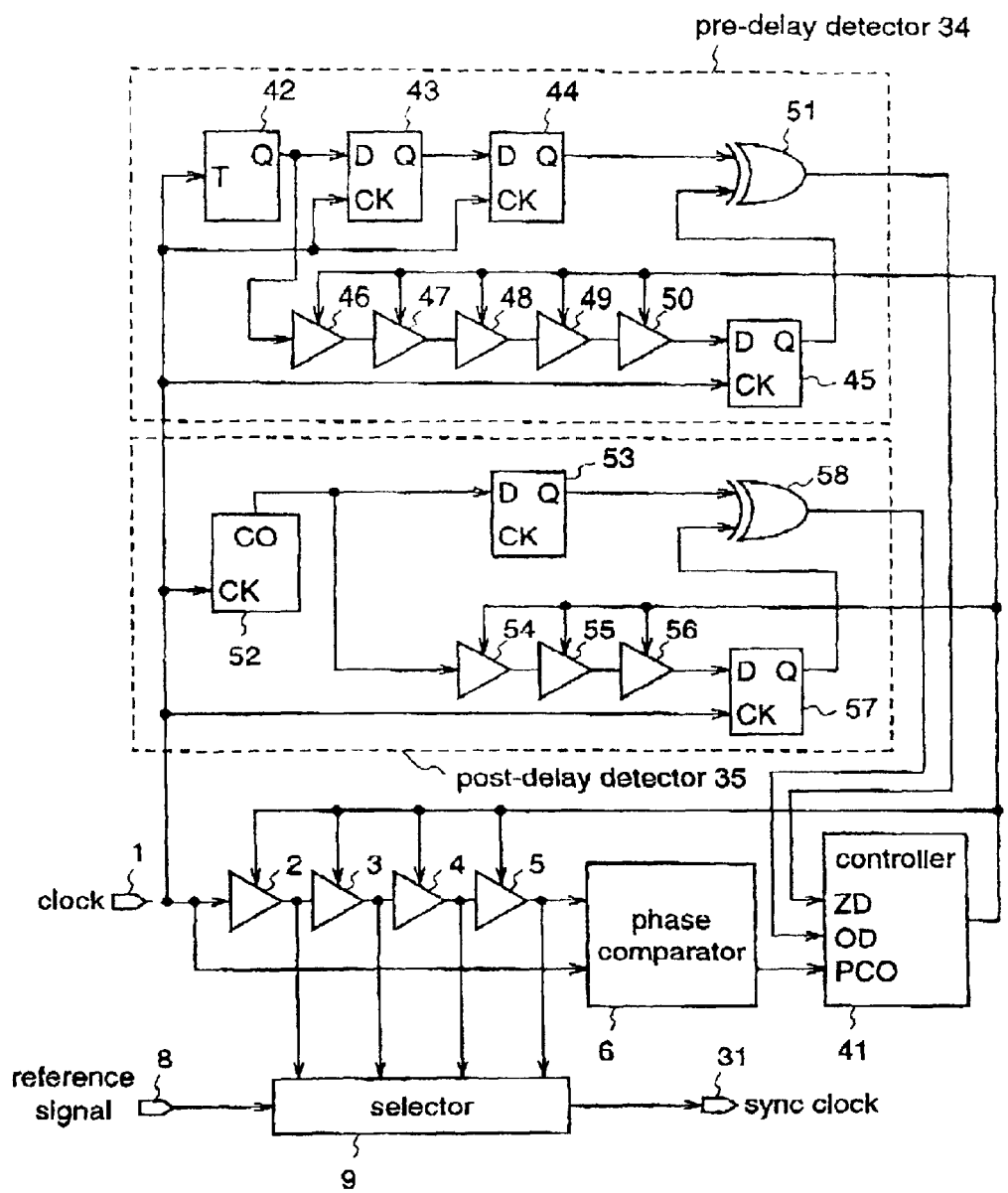
FIG. 6 is a circuit diagram illustrating a semiconductor device according to a third embodiment of the present invention.

FIG. 6 is a circuit diagram illustrating the semiconductor device according to the third embodiment. In this figure, the same reference numerals as those in FIG. 1 denote the same or corresponding elements.

In FIG. 6, the semiconductor device according to the third embodiment comprises a clock input terminal 1, delay elements 2 to 5, a phase comparator 6, a reference signal input terminal 8, a selector 9, a sync clock output terminal 31, a pre-delay detector 34, a post-delay detector 35, and a controller 41.

The pre-delay detector 34 monitors the delays of the clocks outputted from the delay elements 2 to 5 not to be smaller than an acceptable range, thereby preventing the comparison in the phase comparator 6 between the phase of a non-delay clock and the phase of the external clock one clock late. This pre-delay detector 34 is constituted, as shown in FIG. 6, by a T-FF (T-flipflop) 42, FFs 43 to 45, delay elements 46 to 50 having the same delays as those of the delay elements 2 to 5, and an EXOR (Exclusive-OR) 51.

The post-delay detector 35 monitors the delays of the clocks outputted from the delay elements 2 to 5 not to be larger than the accessible range, thereby preventing the comparison in the phase comparator 6 between the phase of the clock that is delayed by two clocks or more and the phase of the external clock one clock late. This post-delay detector 35 is constituted, as shown in FIG. 6, by a counter circuit 52, a FF 53, delay elements 54 to 56 having the same delays as those of the delay elements 2 to 5, a FF 57, and an EXOR 58.

Here, the delays of the delay element 46 to 50 and the delay elements 54 to 56 having the same delays of the delay elements 2 to 5 may take a value that is the same as any of the delays of the delay elements 2 to 5. Or the delays may take an average value of the delays of the delay elements 2 to 5. The delays can be any value as long as the value is decided in association with the delay elements 2 to 5.

The controller 41 controls the respective delays of the delay elements 2 to 5 on the basis of the phase difference output which is outputted from the phase comparator 6 and the signals which are outputted from the pre-delay detector 34 and the post-delay detector 35.

Next, the operation of the semiconductor device according to the third embodiment is described with reference to FIGS. 7.

FIGS. 7(a) to 7(o) are timing charts for explaining the semiconductor device of the third embodiment. FIG. 7(a) shows an output of the delay element 5. FIG. 7(b) shows a signal to be compared that is inputted to the phase comparator 6. FIG. 7(c) shows a dividing pulse that is outputted from the T-FF 42. FIG. 7(d) shows an output of the FF 43. FIG. 7(e) shows an output of the FF 44. FIG. 7(f) shows an output of the delay element 50 at the normal operation. FIG. 7(g) shows an output of the FF 45 at the normal operation. FIG. 7(h) shows an output of the delay element 50 at an improper operation. FIG. 7(i) shows an output of the FF 45 at an improper operation. FIG. 7(j) shows a carry output of the counter 52. FIG. 7(k) shows an output of the FF 53. FIG. 7(l) shows an output of the delay element 56 at the normal operation. FIG. 7(m) shows an output of the FF 57 at the normal operation. FIG. 7(n) shows an output of the delay element 56 at an improper operation. FIG. 7(o) shows an output of the FF 57 at an improper operation.

Initially, the operation of the pre-delay detection circuit 34 is described.

When a signal to be compared as shown in FIG. 7(b) is inputted to the phase comparator 6, this signal is divided by the FF 42 as shown in FIG. 7(c). The divided pulse is delayed by the FF 43 and the FF 44 by two clocks, and a pulse that is delayed by two clocks as shown in FIG. 7(e) is outputted as a delayed pulse from the FF 44 to the EXOR 51.

The divided pulse that has been divided by the FF 42 is delayed by 5/4 clocks by the delay elements 46 to 50 having the same delays as those of the delay elements 2 to 5 (FIG. 7(f) or 7(h)) and then latched by the FF 45, whereby a pulse that is obtained by delaying the divided pulse shown in FIG. 7(c) by two clocks is outputted to the EXOR 51 as the FF45 output as shown in FIGS. 7(g) or 7(i).

Next, the FF44 output is compared with the FF45 output by the EXOR 51. When the FF44 output is equal to the FF45 output, a signal indicating that the delays of the delay elements 2 to 5 are normal is outputted to the controller 41. When the FF44 output is different from the FF45 output, a signal indicating that the delays of the delay elements 2 to 5 are small is outputted to the controller 41.

To be more specific, when the delays of the delay elements 2 to 5 are proper, the FF45 output is a clock signal as shown in FIG. 7(g). Therefore, the clock signal that is outputted from the FF 44 as shown in FIG. 7(e) is synchronized with the input clock shown in FIG. 7(a). Thus, it is judged by the EXOR 51 that the delay elements 2 to 5 are operating at the proper delays, and a signal indicating that the delays are proper is outputted to the controller 41.

On the other hand, when the delays of the delay elements 2 to 5 are decreased by the interferences, and accordingly the total delay of the clocks outputted by the delay elements 46 to 50 becomes smaller than one clock, the FF45 output is a clock signal as shown in FIG. 7(i) and accordingly does not match the FF44 output as shown in FIG. 7(e). Therefore, it is judged by the EXOR 51 that the delays of the delay elements 2 to 5 are smaller than the proper delays, and a signal indicating that the delays are smaller is outputted to the controller 41.

As described above, the controller 41 always monitors the delays of the delay elements 2 to 5 and, when mismatch is detected in the EXOR 51 and a signal indicating that the delays are smaller is outputted to the controller 41, the controller 41 controls the delay values of the delay elements 2 to 5 for being larger, whereby the comparison in the phase comparator 6 between the phase of the non-delay clock and the phase of the external clock one clock late can be prevented.

Next, the operation of the post-delay detector 35 is described.

When the signal to be compared as shown in FIG. 7(b) is inputted to the phase comparator 6, this signal is divided by the counter 52 as shown in FIG. 7(j) and outputted from the counter 52 as a carry output. Then, the carry output is latched by the FF53, and an FF53 output that is delayed by one clock as shown in FIG. 7(k) is outputted to the EXOR 58.

Figure 7:
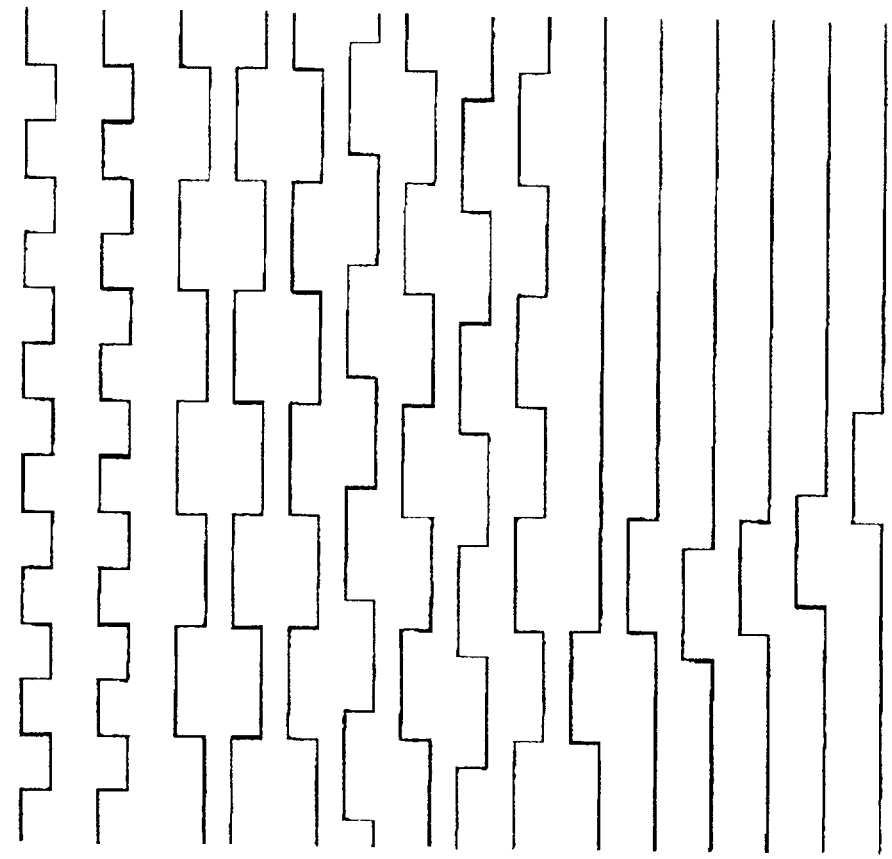
FIGS. 7(a) to 7(o) are timing charts for explaining the semiconductor device according to the third embodiment.

In addition, the carry output that has been divided by the counter 52 is delayed by 3/4 clock by the delay elements 54 to 56 having the same delays as those of the delay elements 2 to 5 (FIGS. 7(1) or 7(n)), and then latched by the FF57, whereby a pulse that is obtained by delaying the carry output shown in FIG. 7(j) by one clock is outputted to the EXOR 58 as an FF57 output as shown in FIG. 7(m) or 7(o).

Next, the FF53 output and the FF57 output are compared with each other by the EXOR 58. When the FF53 output is equal to the FF57 output, a signal indicating that the delays of the delay elements 2 to 5 are proper is outputted to the controller 41. When the FF53 output is different from the FF57 output, a signal indicating that the delays of the delay elements 2 to 5 are larger is outputted to the controller 41.

To be more specific, when the delays of the delay elements 2 to 5 are proper, the FF57 output is a clock signal as shown in FIG. 7(m), and accordingly the clock signal of the FF44 output as shown in FIG. 7(k) and the input clock as shown in FIG. 7(a) are in phases. Then, it is judged by the EXOR 58 that the delays of the delay elements 2 to 5 operate at the proper delays, and a signal indicating that the delays are proper is outputted to the controller 41.

On the other hand, when the delays of the delay elements 2 to 5 are increased by the interferences and accordingly the total delay of the clocks outputted from the delay elements 46 to 50 becomes larger than one clock, the FF57 output is a clock signal as shown in FIG. 7(o) and thus does not match the FF53 output as shown in FIG. 7(k). Therefore, it is judged by the EXOR 58 that the delays of the delay elements 2 to 5 are larger than the proper delays, and a signal indicating that the delays are larger is outputted to the controller 41.

As described above, the controller 41 always monitors the delays of the delay elements 2 to 5 and, when mismatch is detected by the EXOR 58 and a signal indicating that the delays are larger is outputted to the controller 41, the controller 41 controls the delays of the delay elements 2 to 5 for being reduced, whereby the comparison in the phase comparator 6 between the phase of the clock that is delayed by two clocks or more and the phase of the external clock one clock late can be prevented.

Next, the structure and operation of the controller 41 is described in more detail with reference to FIG. 8.

Figure 8:
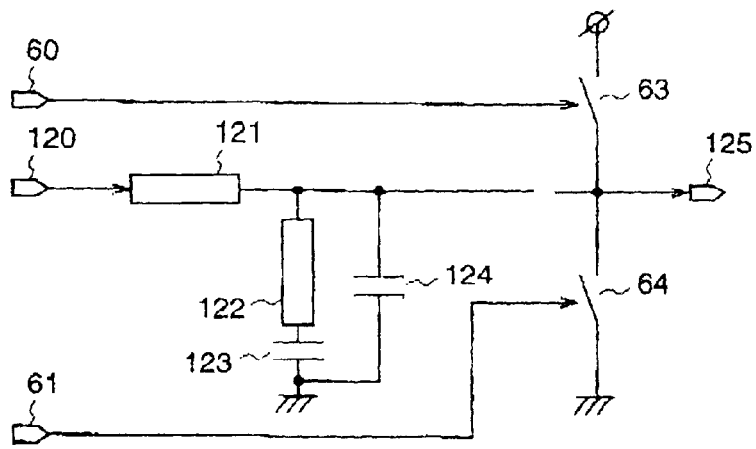
FIG. 8 is a diagram illustrating a structure of a controller of the semiconductor device of the third embodiment.
Figure 9:
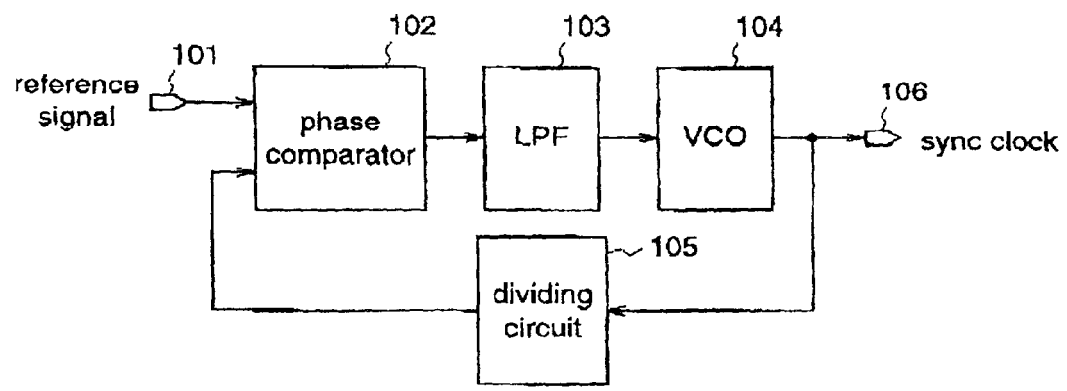
FIG. 9 is a circuit diagram illustrating a semiconductor device according to a first prior art.

FIG. 8 is a circuit diagram illustrating the controller 41 of the semiconductor device according to the third embodiment. The controller 41 is constituted by a phase difference input terminal 120, resistors 121 and 122, capacitors 123 and 124, a control voltage output terminal 125, an over detection input terminal 60, a zero detection input terminal 61, and switches 63 and 64. Here, the phase difference input terminal 120, the resistors 121 and 122, the capacitors 123 and 124, and the control voltage output terminal 125 are the same as those in the conventional LPF as shown in FIG. 13. The operation of the controller 41 that is constructed as described above will be described.

Initially, when a signal that is outputted from the EXOR 58 is inputted through the over detection input terminal 60, and in cases where this input signal is a signal indicating that the delays are proper, the switch 63 is turned OFF. On the other hand, in cases where this signal is a signal indicating that the delays are smaller, the switch 63 is turned ON, thereby forcefully making the delays larger.

On the other hand, when a signal that is outputted from the EXOR 51 is inputted through the zero detection input terminal 61, and in cases where this input signal is a signal indicating that the delays are proper, the switch 64 is turned OFF. On the other hand, in cases where this signal is a signal indicating that the delays are smaller, the switch 64 is turned ON, thereby forcefully making the delays larger.

The semiconductor device according to the third embodiment is provided with the pre-delay detector 34 and the post-delay detector 35, thereby always monitoring the delays of the delay elements 2 to 5. Accordingly, even when the delays of the delay elements 2 to 5 are largely varied by the interferences, the variations in the delays of the delay elements 2 to 5 are detected, whereby the delays of the delay elements 2 to 5 can be controlled by the controller 41. Accordingly, the comparison of the different edges in the phase comparator 6 can be prevented, thereby generating a clock that is accurately synchronized with the reference signal.

In this semiconductor device according to the third embodiment, the delays of the delay elements 2 to 5 are constantly controlled by the phase comparator 6 and the controller 41, whereby even when the delays are affected by interferences such as voltage and temperature, delayed clocks which are shifted in phase with each other by 1/4 clock can be generated as the outputs from the respective delay elements. Further, this semiconductor device is provided with the selector 9 that selects one of the delayed clocks which are shifted in phase with each other by 1/4 clock, on the basis of the phase of the reference signal, whereby the clock can follow even an abrupt variation in the reference signal. Accordingly, even when the interval between the reference signals is larger, the frequencies of the clocks which are outputted from the respective delay elements can be kept constant.

In this third embodiment, in order to simplify the descriptions, with respect to the delay elements of four stages, the delay elements of the pre-delay detector 34 comprises five stages and the delay elements of the post-delay detector 35 comprises three stages. However, when the delay elements comprise N stages (N: an integer that is two or larger), the delay elements of the pre-delay detector 34 comprise (N+1) stages or more and the delay elements of the post-delay detector 35 comprises (N−1) stages or less, thereby obtaining the same effects as those in the third embodiment.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A semiconductor device comprising:
   an external clock input means for receiving an external clock that is a clock to be synchronized;
   N stages of delay elements each delaying the external clock by 1/N clock (N is an integer that is two or larger);
   a phase comparison means for comparing a phase of a clock that has been delayed by the N stages of the delay elements with a phase of the external clock which is one clock late, and detecting a phase difference;
   a control means for controlling respective delays of the delay elements on the basis of the phase difference detected by the phase comparison means;
   a reference signal input terminal for receiving a reference signal which is different from the external clock; and
   a selection means for selecting one of delayed clocks which are generated by the N stages of the delay elements, respectively, and shifted in phase with each other by 1/N clock, the selected delayed clock having a change point that is closest to a change point of the reference signal and outputting the selected clock as a synchronous clock.

2. The semiconductor device of claim 1 wherein the selection means selects a delayed clock having a change point which is behind a change point of the reference signal and is closest thereto, among the delayed clocks which are generated by the N stages of the delay elements, respectively, and are shifted in phase with each other by 1/N clock.

3. A semiconductor device comprising:
   an external clock input means for receiving an external clock that is a clock to be synchronized;
   N stages of delay elements each delaying the external clock by 1/N clock (N is an integer that is two or larger);
   a phase comparison means for comparing a phase of a clock that has been delayed by the N stages of the delay elements with a phase of the external clock one clock late, and detecting a phase difference;
   a control means for controlling respective delays of the delay elements on the basis of the phase difference detected by the phase comparison means;
   a reference signal input terminal for receiving a reference signal which is different from the external clock; and
   a selection means for selecting one of delayed clocks which are generated by the N stages of the delay elements, respectively, and shifted in phase with each other by 1/N clock, on the basis of the reference signal, and outputting the selected clock as a synchronous clock, wherein
   the selection means selects a delayed clock having a change point that is before a change point of the reference signal and is the closest thereto, among the delayed clocks which are generated by the N stages of the delay elements, respectively, and are shifted in phases with each other by 1/N clock.

4. A semiconductor device comprising:
   an external clock input means for receiving an external clock that is a clock to be synchronized;
   N stages of delay elements each delaying the external clock by 1/N clock (N is an integer that is two or larger);
   a phase comparison means for comparing a phase of a clock that has been delayed by the N stages of the delay elements with a phase of the external clock one clock late, and detecting a phase difference;
   a control means for controlling respective delays of the delay elements on the basis of the phase difference detected by the phase comparison means;
   a reference signal input terminal for receiving a reference signal; and
   a selection means for selecting one of delayed clocks which are generated by the N stages of the delay elements, respectively, and shifted in phase with each other by 1/N clock, on the basis of the reference signal, and outputting the selected clock as a synchronous clock, wherein the selection means comprises:
      a latch circuit for latching each of the delayed clocks which are generated by the N stages of the delay elements, respectively, and are shifted in phase with each other by 1/N clock, in accordance with the reference signal;
      a control circuit for deciding a timing of the clock selection; and
      a multiplexer for receiving outputs from the latch circuit, and selecting one of the delayed clocks which are shifted in phase with each other by 1/N clock, at the decided timing that is outputted by the control circuit.

5. A semiconductor device comprising:
   an external clock input means for receiving an external clock that is a clock to be synchronized;
   N stages of delay elements each delaying the external clock by 1/N clock (N is an integer that is two or larger);
   a phase comparison means for comparing a phase of a clock that has been delayed by the N stages of the delay elements with a phase of the external clock one clock late, and detecting a phase difference;
   a control means for controlling respective delays of the delay elements on the basis of the phase difference detected by the phase comparison means;

a reference signal input terminal for receiving a reference signal;

a selection means for selecting one of delayed clocks which are generated by the N stages of the delay elements, respectively, and shifted in phase with each other by 1/N clock, on the basis of the reference signal, and outputting the selected clock as a synchronous clock; and a clock stop means for temporarily stopping the delayed clocks which are generated by the N stages of the delay elements, respectively, and are shifted in phase with each other by 1/N clock, at the clock selection by the selection means.

6. A semiconductor device comprising:

an external clock input means for receiving an external clock that is a clock to be synchronized;

N stages of delay elements each delaying the external clock by 1/N clock (N is an integer that is two or larger);

a phase comparison means for comparing a phase of a clock that has been delayed by the N stages of the delay elements with a phase of the external clock one clock late, and detecting a phase difference;

a control means for controlling respective delays of the delay elements on the basis of the phase difference detected by the phase comparison means;

a reference signal input terminal for receiving a reference signal;

a selection means for selecting one of delayed clocks which are generated by the N stages of the delay elements, respectively, and shifted in phase with each other by 1/N clock, on the basis of the reference signal, and outputting the selected clock as a synchronous clock;

a pre-delay detection means for detecting whether or not the delays of the N stages of the delay elements are smaller than a predetermined value, and outputting an obtained result to the control means, and the control means controlling the N stages of the delay elements on the basis of the output from the pre-delay detection means so that the delays have the predetermined value.

7. The semiconductor device of claim 6 wherein.

the pre-delay detection means includes:

a dividing circuit for dividing the external clock;

a first latch circuit comprising latch circuits of two or more stages for receiving an output from the dividing circuit and delaying the output in clock units;

delay elements of (N+1) stages or more which receive the output from the dividing circuit and have the same delays as those of the N stages of the delay elements;

a second latch circuit for latching an output from the delay elements of (N+1) stages or more, in accordance with the external clock; and a comparator for comparing an output from the first latch circuit with an output from the second latch circuit.

8. A semiconductor device comprising:

an external clock input means for receiving an external clock that is a clock to be synchronized;

N stages of delay elements each delaying the external clock by 1/N clock (N is an integer that is two or larger);

a phase comparison means for comparing a phase of a clock that has been delayed by the N stages of the delay elements with a phase of the external clock one clock late, and detecting a phase difference;

a control means for controlling respective delays of the delay elements on the basis of the phase difference detected by the phase comparison means;

a reference signal input terminal for receiving a reference signal;

a selection means for selecting one of delayed clocks which are generated by the N stages of the delay elements, respectively, and shifted in phase with each other by 1/N clock, on the basis of the reference signal, and outputting the selected clock as a synchronous clock;

a post-delay detection means for detecting whether the delays of the N stages of the delay elements are larger than a predetermined value, and outputting an obtained result to the control means; and the control means controlling the N stages of the delay elements on the basis of the output from the post-delay detection means so that the delays have a predetermined value.

9. The semiconductor device of claim 8 wherein the post-delay detection means includes:

a dividing circuit for dividing the external clock;

a third latch circuit for receiving an output from the dividing circuit and delaying the output by one clock;

delay elements of (N−1) stages or less which receive the output from the dividing circuit and have the same delays as those of the N stages of the delay elements;

a fourth latch circuit for latching an output from the delay elements of (N−1) stages or less, in accordance with the external clock; and a comparator for comparing an output from the third latch circuit with an output from the fourth latch circuit.

* * * * *